United States Patent [19]

Egan et al.

[11] Patent Number: 4,583,372
[45] Date of Patent: Apr. 22, 1986

[54] METHODS OF AND APPARATUS FOR STORING AND DELIVERING A FLUID

[75] Inventors: James J. Egan, Allentown; Jeffrey T. Koze, Whitehall; Henry Y. Kumagai, Allentown, all of Pa.

[73] Assignee: AT&T Technologies, Inc., Berkeley Heights, N.J.

[21] Appl. No.: 696,279

[22] Filed: Jan. 30, 1985

[51] Int. Cl.⁴ ............................................. F17C 7/02
[52] U.S. Cl. ............................................. 62/53; 62/55
[58] Field of Search ................................ 62/52, 53, 55

[56] References Cited

U.S. PATENT DOCUMENTS

| | | | |
|---|---|---|---|
| 1,930,731 | 10/1933 | Thompson | 62/1 |
| 2,842,942 | 7/1958 | Johnston et al. | 62/50 |
| 3,491,538 | 1/1970 | Pearson | 60/52 |
| 3,572,047 | 3/1971 | Hatfield | 62/55 |
| 3,797,262 | 3/1974 | Eigenbrod | 62/52 |
| 3,803,858 | 4/1974 | Simon | 62/52 |
| 4,175,395 | 11/1979 | Prost et al. | 62/52 |
| 4,235,829 | 11/1980 | Partus | 261/121 |
| 4,277,950 | 7/1981 | Eigenbrod et al. | 62/55 |

Primary Examiner—Ronald C. Capossela
Attorney, Agent, or Firm—Winfrid O. Schellin; James H. Fox

[57] ABSTRACT

A fluid (12), such as dichlorosilane, is stored in a pressure vessel (17) located at a site remote from a processing facility within the confines of a building (14). At such remote site the pressure vessel (17) is subject to climatic temperature variations over a range at the lower temperatures of which a vapor pressure of the fluid may be insufficient to generate a pressure within the pressure vessel to drive the fluid through a duct (36) toward the processing facility. A supply of an inert gas (34) is applied at a first predetermined pressure to the pressure vessel (17) to urge the fluid under such predetermined pressure through the duct (36) toward an evaporator vessel (38) located at the processing facility. The evaporator vessel (38) is maintained at a first predetermined elevated temperature at which the fluid at such first predetermined pressure is in a gaseous state. Any of the fluid urged toward and entering the evaporator vessel (38) is evaporated, such that a supply of the fluid in its gaseous state at the first predetermined pressure is maintained within the evaporator vessel (38). Fluid is drawn from the evaporator vessel and its pressure is reduced, advantageously by a heated regulator (43), to a second predetermined and stable pressure at which the fluid remains a gas at temperatures existing at the processing facility within the building (14). The amount of the fluid within the confines of the building (14) is by the described method and apparatus kept near a practical minimum.

18 Claims, 3 Drawing Figures

METHODS OF AND APPARATUS FOR STORING AND DELIVERING A FLUID

TECHNICAL FIELD

The present invention relates to methods of and apparatus for storing and delivering to a usage destination a fluid which has vapor pressure characteristics to cause a phase change of gas to liquid within the range of typical atmospheric temperature variations. The invention relates particularly to methods of and apparatus for storing and delivering a chemically active fluid with the above-mentioned vapor pressure characteristics to a usage destination in a confined space where the risk of explosion and fire needs to be minimized.

BACKGROUND OF THE INVENTION

Semiconductor device manufacturing operations use chemical vapor deposition processes to deposit, for example, epitaxial silicon, poly-crystalline layers of silicon, and other layers of compounds containing silicon, such as silicon nitride. Dichlorosilane is a state-of-the-art silicon source chemical in such chemical vapor deposition processes. Storing dichlorosilane indoors to supply the needs of chemical vapor deposition apparatus for semiconductor processes is regarded to be a potential hazard because of the tendency of dichlorosilane to explode and burn when it is allowed to accumulate in the presence of oxygen.

Storing dichlorosilane outdoors and delivering it as a gas through appropriate tubing to a usage destination within the confines of a processing facility meets with difficulties in that at the lower temperatures of typical atmospheric temperature ranges insufficiently high gas pressures are generated to deliver the gas to its destination. Heating the fluid supply to a controlled temperature and thereby generating gas at a controlled vapor pressure overcomes the problem of insufficient gas pressure at lower temperatures. However, delivering the generated gas at such a controlled temperature from an external storage facility to the usage destination involves impractical and expensive safety and operating procedures. The requirements for insulation, the complexity of temperature controls, and the operating costs to provide adequate venting of an external storage facility tend to be excessive.

SUMMARY OF THE INVENTION

In accordance with the present invention, a preferred method of storing and delivering a fluid comprises storing the fluid in its liquid state in a pressure vessel located at a site remote from a processing facility. The fluid is delivered as a liquid from the pressure vessel under a first pressure to an evaporator. The evaporator is maintained at a first temperature above an ambient temperature range to evaporate the fluid entering the evaporator, such that the evaporator contains a supply of the fluid in its gaseous state at such first pressure. The fluid is drawn off from the evaporator and its pressure is reduced to a second pressure at which it retains its gaseous state at ambient temperatures within the processing facility. The fluid is delivered at such second pressure to its usage destination within the processing facility.

Apparatus in accordance with the invention includes a vessel for storing the fluid, an evaporator, and a provision for driving the fluid in its liquid state under pressure from the vessel to the evaporator. A temperature control provision at the evaporator raises the temperature of the fluid in the evaporator to a first predetermined temperature at which the fluid becomes a gas. A gas pressure regulator coupled between the evaporator and a delivery duct located within the confines of a processing facility lowers the pressure of the fluid to a second pressure at which the fluid remains a gas at ambient temperatures within the processing facility such that the fluid is delivered as a gas to a usage destination within the processing facility.

In a particular embodiment of the invention the gas pressure regulator coupled between the evaporator and a duct for delivering the fluid to the usage destination includes a provision for maintaining the regulator at an elevated temperature above ambient temperatures to prevent the fluid from condensing within the regulator.

BRIEF DESCRIPTION OF THE DRAWING

Various features and advantages of the invention are best understood when the following detailed description of a preferred embodiment thereof is read in reference to the appended drawing, wherein.

DETAILED DESCRIPTION

The Apparatus And Its Function

Figure 1:
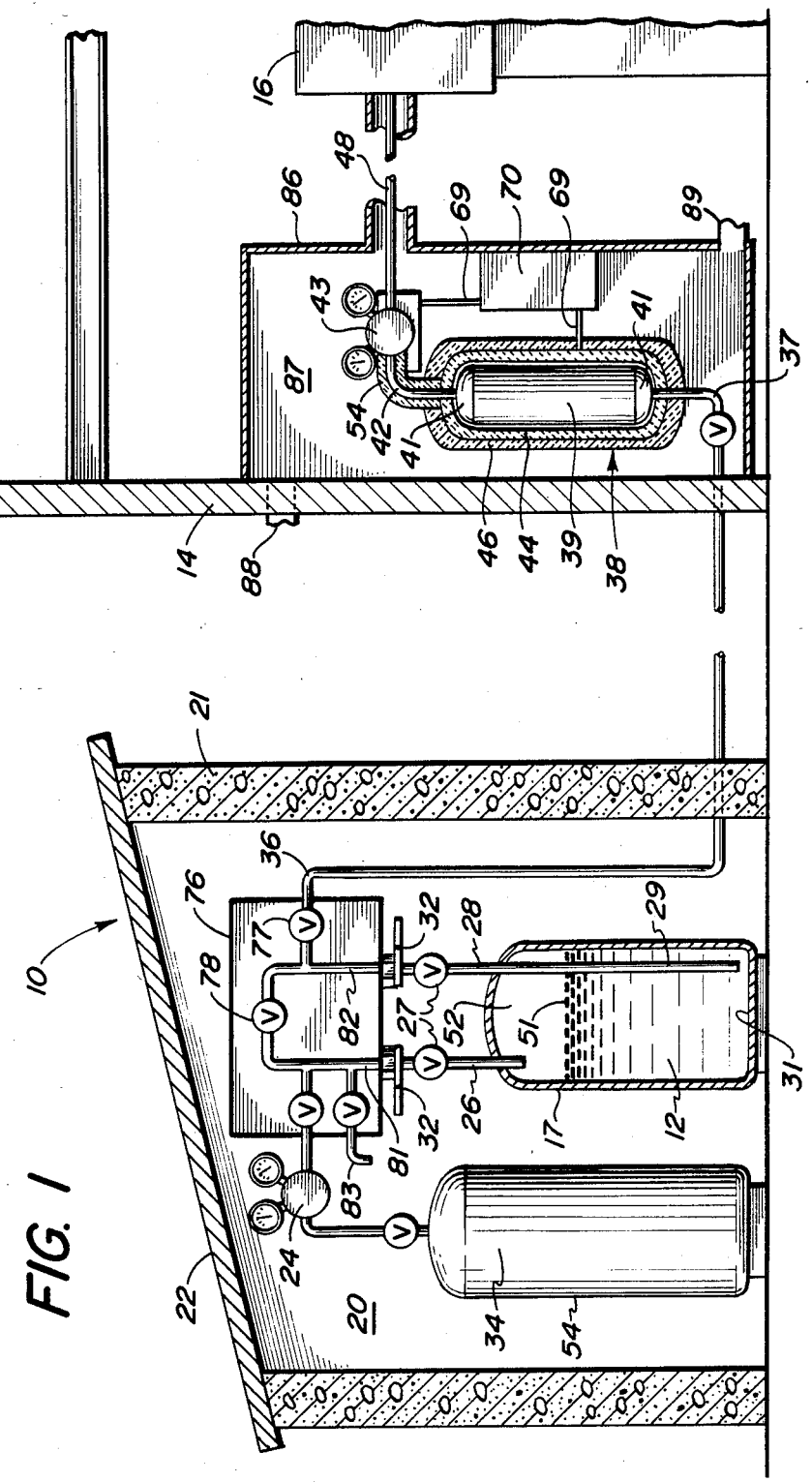
FIG. 1 is a simplified representation of a fluid storage and delivery apparatus which includes features of the present invention.

FIG. 1 is a simplified representation of apparatus, designated generally by the numeral 10, which comprises a system for storing a supply of a potentially hazardous fluid 12, such as dichlorosilane, at a site remote from a processing facility, designated generally as building 14, and for delivering such fluid at a desirable usage rate to a usage destination 16 within the building 14. In the described example the usage destination 16 is a state-of-the-art chemical vapor deposition apparatus such as, for example, a Model 7805, available from Applied Materials, Incorporated, Santa Clara, Calif.

Such chemical vapor deposition apparatus 16 is a typical piece of equipment used in semiconductor device processing operations. The apparatus 16, like most semiconductor processing equipment, is maintained under controlled environmental conditions in a confined space represented by the building 14. Because of the high cost of such deposition apparatus 16, downtime of the apparatus is desirably minimized. For substantially continuous operations, except for loading or unloading of workpieces, a steady supply of reactive chemicals, such as dichlorosilane, needs to be delivered to the apparatus 16. However, the need for a ready supply of dichlorosilane conflicts with an ever present need for safety. As a highly reactive chemical, dichlorosilane is likely to explode or burn should it accidentally become mixed with oxygen in an uncontrolled manner, such as by a leak into environmental air. Thus, for safety reasons the amount of dichlorosilane which is present at any one time within the confines of the building 14 should be minimized.

Consequently, dichlorosilane 12 typically is stored as a liquid under pressure in a storage vessel 17, typically a 75 liter pressure tank, on the outside of the building 14. Even though the vessel 17 is located in a storage space 20 which is accessible to the open air, a semi-shelter, such as a protective wall 21 supporting a typical lean-to roof 22 is preferred to protect various more sensitive external components such as a pressure regulator 24 or other components and gauges, from exposure to direct sunlight, rain, snow or the like. Nevertheless, vessel 17 typically is exposed to weather and climate dependent temperature variations.

The storage vessel 17 is a common industrial fluid container having a top access port 26 which is capped by a common shut-off valve 27. A bottom access port 28 is also capped by one of the common shut-off valves 27 and is coupled on the inside of the vessel 17 to a feeder tube 29 which is tapped near a bottom surface 31 of the vessel 17.

Typical couplings 32 connect the top access port 26 to a supply of an inert gas 34, such as helium, under pressure, and connect the bottom access port 28 to a delivery duct or tube 36. As seen in FIG. 1, such connections to gas 34 and delivery tube 36 are through a manifold 76, the purposes and advantages of which will be described in more detail hereinbelow.

The delivery tube 36 is routed directly without thermal protection from the storage space 20 into the building 14, providing a ready supply of dichlorosilane at the building 14. However, the amount of dichlorosilane within the building 14 is minimized by limiting the amount of liquid phase dichlorosilane within the confines of the building 14 to substantially no more than the amount within tube portions 37 between the wall of the building 14 and an evaporator 38.

The evaporator 38 is a vessel which has a cylindrical center 39, preferably about 3 inches in diameter and about 8 inches high. The vessel, in the preferred embodiment, is closed off at each end by hemispherical caps 41. The tube portion 37 is coupled through the lower cap 41 to the evaporator, and a similar tube portion 42 is coupled through the upper cap 41 of the evaporator and is routed from there to a pressure reducing gas regulator 43. The vessel of the evaporator is encased by a fitted thermostatically controlled electric heater blanket 44. An outer insulator blanket 46 contains heat generated by the blanket 44 and directs the heat inward toward the vessel of the evaporator 38.

From the gas regulator 43 a feeder tube 48 is routed to the chemical vapor deposition apparatus 16 as a typical usage destination of the dichlorosilane. While it will be understood that a variety of types of apparatus may use the dichlorosilane or other chemical compositions in vapor form at various pressures or even at pressures below that of atmospheric pressure, a representative vapor deposition apparatus 16 throttles the dichlorosilane into a reaction chamber at substantially atmospheric pressure.

However, to assure an adequate flow rate of the dichlorosilane over a representative distance of approximately 100 feet or more, the output pressure of the gas regulator 43 is preferred to be between 8 and 9 pounds per square inch above atmospheric pressure (PSIG). Under such conditions, it has been found that a minimum pressure of 15 PSIG in the evaporator assures an adequate available pressure drop between the input and the output of the gas regulator 43 to effect a fully regulated pressure of 9 PSIG in the feeder tube 48. To maintain such pressures, the wall temperature of the evaporator 38 preferably is maintained at about 160 degrees Fahrenheit (°F.) to heat the liquid dichlorosilane flowing into the evaporator 38 to the established temperature of 160° F.

Figure 2:
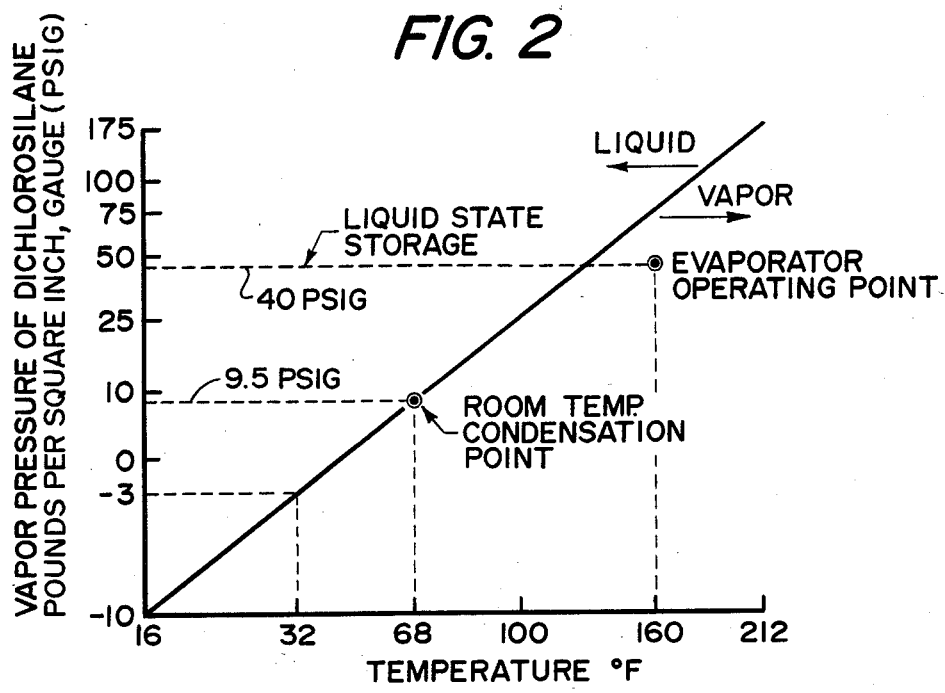
FIG. 2 is a diagram showing the temperature related vapor pressures of dichlorosilane as a typical fluid which is advantageously stored and delivered by the apparatus of FIG. 1.

Referring to the temperature related vapor pressure characteristics of dichlorosilane in the diagram of FIG. 2, the vapor pressure of dichlorosilane at 160° F. is about 82 PSIG. Thus, as long as the pressure in the evaporator remains less than 82 PSIG, any dichlorosilane entering the evaporator becomes a gas as it is heated to the temperature within the evaporator. Under such conditions the volume of the evaporator 38 will consequently fill with dichlorosilane in its gaseous state and will prevent further liquid dichlorosilane from entering the heated envelope of the evaporator 38.

Referring back to FIG. 1, it will be realized that the pressure head in the evaporator 38 is maintained in equilibrium with a total pressure head existing in the storage vessel 17. The pressure head in the vessel 17 is essentially determined by the gas pressure of a volume of gas 52 in the vessel 17 above the liquid level in the storage vessel 17. Variations due to pressure head differences between the liquid in the tube portion 37 at the base of the evaporator 38 and the liquid in the storage vessel 17 are minor in relationship to the preferred pressure in the vessel 17 and, hence, in the evaporator.

FIG. 2 shows that for dichlorosilane an approximate vapor pressure variation of 10 to 15 pounds per square inch can be expected over temperature ranges which lie within typical daily temperature extremes. A problem with respect to the characteristic gas pressure of dichlorosilane is immediately recognized, in that, particularly in colder climates, the vapor pressure at expected nighttime temperatures may be insufficient to supply dichlorosilane at an adequate pressure to the evaporator 38.

A nominal supply pressure of 40 PSIG to drive the dichlorosilane to the evaporator 38 has been found to be an optimum. In accordance with this embodiment of the invention, the selected supply pressure is established under normal operating conditions by a regulated supply of gas 34 which is chemically inert with respect to the dichlorosilane. A pressure tank 54 of the inert gas 34, preferably helium, is coupled through the gas regulator 24 and through the top access port 26 to the volume of gas 52 above the liquid level 51 of the dichlorosilane in the storage vessel 17. A predetermined supply pressure is set at the regulator 24, taking into consideration a currently existing environmental temperature and, hence, a currently existing partial vapor pressure of the dichlorosilane, to maintain a pressure in the volume 52 in a pressure range about the selected 40 PSIG.

As an example, the gas regulator 24 may be set during early morning temperatures when the current temperature is less than a mean of the expected range of daily temperatures to a regulated output pressure which lies below the nominal 40 PSIG by one half of an expected gas pressure variation range of the dichlorosilane. Thus, the initial early morning pressure of the regulator 24 could be set at an output pressure of about 35 PSIG.

The pressure of the volume of gas 52 is comprised of the sum of the partial pressures of the inert driving gas, such as helium, and the vapor pressure of dichlorosilane which is related to the temperature of the liquid dichlorosilane in the storage vessel 17 through the vapor-liquid equilibrium relationship as shown in FIG. 2. During the normal daily rise in atmospheric temperature the pressure within vessel 17 may rise from the initial 35 PSIG to 45 or 50 PSIG at midday. This increase in pressure arises from warming of the liquid dichlorosilane in the storage vessel 17 and the resulting increase in its vapor pressure. The pressure in the gas volume 52 is balanced by an equal pressure inside the volume of the evaporator 38 because of the common delivery tube 36, 37 connecting the storage vessel 17 and the evaporator 38.

The volume inside the evaporator 38 is occupied with 100% dichlorosilane gas; this gas, or vapor, phase resulting as a consequence of maintaining the temperature of the evaporator 38 to the right of the vapor-liquid equilibrium line of FIG. 2. FIG. 2 shows that, as long as the evaporator 38 is maintained at 160° F., condensation of liquid dichlorosilane inside the evaporator is prevented until the pressure inside the evaporator reaches about 82 PSIG. As the total gas pressure in volume 52 rises, liquid dichlorosilane is forced into the evaporator and is converted to gas. As the additional dichlorosilane is vaporized, the pressure in the evaporator rises until the increased pressure balances the total gas pressure in the volume 52 inside the storage vessel 17 and additional dichlorosilane is prevented from entering the evaporator and, thus, an equilibrium condition is again established.

Of course, for safety it may be desirable to couple a pressure switch to tube 42 and a valve, controlled by the pressure switch, in line 36 or 37 to shut off the liquid in line 37 in the event of a malfunction of any kind which could produce excessive pressure in evaporator 38 and tube 42. Although such safety switch and valve are not shown in the drawing, such use will be understood to be conventional in the art.

As will be realized from the above example, under normal operating conditions of the apparatus 10, the gas pressure of the dichlorosilane in the evaporator 38 remains at all times substantially equal to the gas pressure in the volume 52 of gas above the liquid dichlorosilane in the storage vessel 17. Thus, the gas pressure in the volume 52 outside of the building 14 determines the pressure of the gaseous dichlorosilane in the evaporator 38 to be supplied to the input side of the gas regulator 43 within the building. By such relatively simple equilibrium mechanism, the heated evaporator effectively limits the amount of dichlorosilane which is maintained in the building. As a gas, and at an upper limit of the preferred operating pressures, dichlorosilane occupies about 50 times the space of liquid dichlorosilane. Thus, by allowing liquid dichlorosilane to enter the evaporator only on a demand basis and to evaporate, the admitted dichlorosilane immediately replenishes the gas supply as some of the gas is drawn off through the regulator 43. The amount of dichlorosilane stored as a liquid within the building 14 is minimized by the described embodiment to the quantity of dichlorosilane which is found in the tube portion 37 which feeds the dichlorosilane into the evaporator 38.

The Gas Regulator 43

Referring again to FIGS. 1 and 2, as the gaseous dichlorosilane exits the evaporator 38, it can be affected by the environmental temperature within the building 14, which will be assumed to be at normal room temperature, or 68° F. FIG. 2 shows dichlorosilane to undergo a phase change to liquid if it is cooled to about 120° F. at the selected operating pressure in a normal range about 40 PSIG.

Advantageously, heat conducted along the wall of the tube portion 42 from the evaporator 38 maintains the dichlorosilane in its gaseous state between the evaporator and the gas regulator 43. In addition, the tube portion may be insulated by a jacket 54 to aid the heat conduction mechanism in maintaining the tube portion at a temperature near that of the evaporator 38. However, a problem of controlling the output pressure of the gas regulator 43 has been traced to a condensation of dichlorosilane at the pressure interface between the input and output pressures of the regulator 43.

Figure 3:
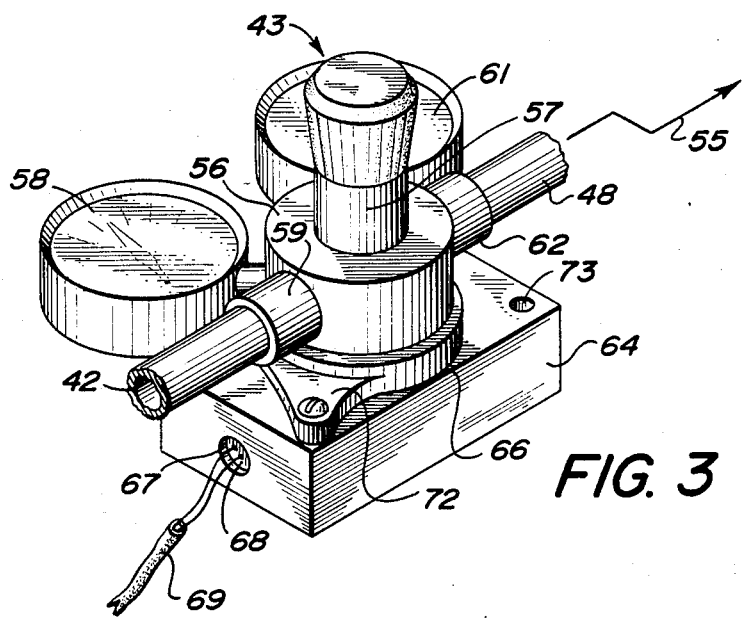
FIG. 3 is a drawing of a gas pressure regulator including particular features of the present invention.

FIG. 3 shows a feature in the structure of the regulator 43 which eliminates uncontrolled, sudden pressure changes of the dichlorosilane in the feeder tube 48 through which the dichlorosilane is delivered as a gas to a usage destination in the direction of the arrow 55. Basic operational elements of the regulator 43 are state-of-the-art elements. For example, a standard regulator housing 56 of the regulator 43 supports a typical, state-of-the-art center output pressure adjustment stem 57. The pressure regulation mechanism is a typical, well known, bias force controlled throttling valve mechanism (not shown) which is located within the housing 56. An input pressure gauge 58 is coupled into the high pressure side of the regulator 43 to which a fluid is fed through an input port 59.

In the described example, the tube portion 42 is coupled to the input port 59. An output pressure gauge 61 is similarly coupled to the low pressure, output side of the regulator 43. An output port 62 couples the output side to the feeder tube 48. Thus, the regulator 43 described up to now functions as a typical state-of-the-art regulator available, for example, from the Tescom Corporation of Elk River, Minn.

However, in contrast to prior art regulators, the regulator 43 features a provision for raising the temperature of the regulator to a predetermined elevated temperature with respect to ambient temperatures. The described embodiment shows a heated mounting base 64 which mounts against an underside of a bottom flange 66 of the housing 56.

The mounting base 64 has a cavity 67 which houses a heater element 68. The mounting base 64 conducts and distributes heat generated by the heater element 68 to the regulator housing 56. The heater element 68 in the described, preferred example is an electrical resistance heater. The element 68 is electrically coupled by conventional electrical leads 69 to an electrical power supply and control module 70 which is shown schematically in FIG. 1. The module 70 also controls the temperature of the evaporator 38.

Referring back to the described features in FIG. 3, it has been found that the addition of the heated mounting base 64 eliminates otherwise observable sudden and unaccounted for pressure changes from regulator 43 and into feeder tube 48. As a possible explanation, it appears that small amounts of condensation tend to restrict the normally throttled flow of gas through the throttling valve, causing such valve to open further than it would in the absence of such condensation. If the condensed fluid suddenly dislodges itself and passes through the regulator valve into the feeder tube 48, the flow-restricting blockage disappears and a larger amount of gas surges suddenly into the feeder tube 48. A resulting sudden increase in pressure in the feeder tube may become aggravated or prolonged by a subsequent evaporation of any dislodged condensate within the feeder tube 48.

An additional advantage of heating the regulator 43, and thereby eliminating condensation of reactant gases, is a substantial decrease of corrosive reactions by reactant condensates on internal metal surfaces of the regulator 43. It is well known that when dichlorosilane condenses in the presence of any moisture, hydrochloric acid forms; and it has been found, for example, that unheated pressure regulators controlling the flow of vapor phase hydrochloric acid are subject to severe corrosion, often failing after only a few weeks of service. With the use of the heated regulator 43 no noticeable deterioration is observed.

The heated mounting base 64 of the regulator 43 adapts the regulator 43 to effectively control a pressure change in a fluid which is maintained as a gas near its condensation point. The heater element 68 may be a commercially available heater cartridge, such as a CHROMALOX heater cartridge, Model CIR-2024, which operates to maintain the regulator housing at substantially the same temperature as that of the evaporator 38. As a brief reference to vapor diagram of FIG. 2 will confirm, the desirable operating temperature of the regulator 43 lies well into the vapor range of the fluid being regulated, such as the dichlorosilane, to achieve the described advantages.

Referring back to FIG. 3, the mounting base 64 is adapted to mount to the regulator 43 by having tapped holes in alignment with holes in standard mounting lugs 72 of the regulator. Mounting holes 73 in the mounting base 64 allow the base to be mounted to any desirable mounting surface. However, in the preferred embodiment the regulator 43 is structurally supported by the incoming tube portion 42 and the feeder tube 48, such that the heated mounting base 64 does not contact heat conductive, solid surfaces other than the underside 66 of the regulator housing.

Commercial Applications

The above-described apparatus finds commercial application in a fluid storage and delivery system which includes various standard safety and operating features in addition to the described features and the described mode of operation in accordance with the invention.

One of the safety features which reduces the risk of atmospheric air entering open fluid tubes during an exchange of an empty storage vessel 17 for a filled one is a helium bleeder and purging manifold 76 shown schematically in FIG. 1. In principle, and described in a readily understood manner, a typical bleeder and purging manifold 76 can be as follows. Before the storage vessel 17 is disconnected from the apparatus 10, the shut off valves 27 and a safety valve 77 are closed. An interconnect valve 78 is opened to couple the source of inert gas 34 to the manifold termination ducts 81 and 82 which communicate with couplings 32. A purging operation is now preferred before the storage vessel 17 is removed. In a routine purging operation the terminations 81 and 82 are cyclically pressurized with inert gas which is vented through a valved vent 83.

The couplings 32 are then uncoupled and the storage vessel 17 is removed and replaced by a filled vessel 17. During the exchange of the vessels 17 inert gas bleeds from both open couplings 32 at the terminations 81 and 82. The bleeding gas prevents oxygen or air from entering into the apparatus 10. After the replacement storage vessel 17 has been coupled into the apparatus 10, the terminations 81 and 82 are again cycled through pressure and venting cycles, whereby the gas is again cyclically vented through the valved vent 83 to assure an inert environment in the bleeder and purging provision 76 before the interconnect valve 78 is closed and ultimately the safety valve 77 is opened and the new supply is reconnected to the apparatus 10 by opening the valves 27.

A further safety provision shown in FIG. 1 is a protective enclosure for dichlorosilane-carrying elements within building 14, such as a vented envelope 86 which shields the environment within the building 14 from direct contact with any vessel, duct or tube carrying dichlorosilane. Confines 87 within the envelope 86 are vented through vents 88 and 89.

Typically for dichlorosilane gas, which is heavier than air, envelope 86 would be continuously purged by a continuous flow of air into upper duct 88 and out lower duct 89 to a suitable exhaust (not shown). Advantageously, a dichlorosilane gas detector will be positioned in exit duct 89 and will be coupled to an alarm or an automatic shut off valve so that a detection of dichlorosilane within the confines 87 will allow the apparatus to be shut down and repaired without danger of accumulating dichlorosilane within the confines of the envelope 86.

Modifications

Various changes and modifications are possible within the spirit and scope of the invention, of which the described embodiment represents a specific example to illustrate the various features and advantages of the invention. It must be realized, for example, that references to dichlorosilane as a fluid being stored and delivered in accordance with the described features is merely an example of a typical fluid which is advantageously handled by the described apparatus. Other fluids, such as boron trichloride, the delivery of which experiences similar problems, are also advantageously handled in the manner described herein. Also, helium as a preferred inert gas should also be considered as a mere example of a driving fluid. For example, it is believed possible to substitute argon for the helium as a driving gas.

Modifications and changes within the scope of the invention may involve, among other changes, and without limitation, the physical placement and arrangement of the described elements. It is, for example, possible to place the evaporator 38 on the outside of the building 14 against its outside wall and allow the fluid to be drawn only as a gas into the confines of the processing facility. The described placement of the evaporator 38 immediately on the inside of the building 14 is presently preferred for a more tightly controlled operating temperature of the evaporator 38, for example.

Various changes and modifications are possible with respect to the heated gas regulator 43. For example, the housing 56 and the mounting base 64 may be a unitary element as, for example, a casting or a single machined part. The cavity 67 which houses the heater element 68 is thereby found within the unitary body and the heat supply to the working faces at which a condensation is to be avoided is facilitated. Also, a heat source other than the described single cartridge type heater may be provided to eliminate erratic pressure regulation of the fluid.

Alternatively, a uniformly heated envelope which encases the housing 56 of the regulator 43 may replace the described heater cartridge. Also a heat source other than electrical resistance heat may be used to raise the housing 56 to a preselected temperature above the condensation point of the fluid regulated by the regulator.

Further, although the liquid storage vessel 17 is shown in FIG. 1 as being in a space 20 physically spaced from building (process facility) 14, it will be appreciated that such spacing is not necessary to this invention. Rather the term "remote" from building 14 is intended to include the vessel being outside and adjacent building 14, such that, for example, wall 21 may in fact be an outside wall of building 14.

Other possible changes and modifications may be made with respect to other described elements of the apparatus without deviating from the spirit and scope of the invention.

What is claimed is:

1. A method of storing and delivering a fluid, comprising:
   storing the fluid in its liquid state in a pressure vessel located at a site remote from a processing facility;
   delivering the fluid in its liquid state under a first predetermined pressure to an evaporator vessel located at the processing facility;
   maintaining the evaporator vessel substantially at a first predetermined temperature above an ambient temperature range, such that the fluid at such first predetermined temperature and first predetermined pressure is substantially always in a gaseous state, thereby evaporating the fluid entering the evaporator vessel and maintaining in the evaporator vessel a supply of the fluid in its gaseous state at such first predetermined pressure;
   drawing fluid from the supply of fluid in the evaporator vessel for use within the processing facility;
   reducing the pressure of such drawn off fluid to a second predetermined pressure of such magnitude at which the fluid retains its gaseous state at a temperature in a range expected to be maintained within the processing facility; and
   delivering the fluid at substantially such second predetermined pressure to a usage destination within the processing facility.

2. A method of storing and delivering a fluid according to claim 1, wherein delivering the fluid in its liquid state under a first predetermined pressure to an evaporator vessel comprises:
   applying a nonreactive gas at said first predetermined pressure to the pressure vessel; and
   urging the fluid under the combined pressure of the applied nonreactive gas and vapor pressure of the fluid through a duct coupled to the evaporator vessel located at the processing facility.

3. A method of storing and delivering a fluid according to claim 2, wherein storing the fluid in its liquid state in a pressure vessel located at a site remote from a processing facility comprises storing the fluid at a site which is subject to climatically determined temperature variations, and wherein applying a nonreactive gas at said first predetermined pressure to the pressure vessel comprises observing a currently existing climatically determined environmental temperature, comparing such observed currently existing temperature with an expected range of temperatures, and adjusting a pressure at which the nonreactive gas is applied to a value which is less than the first predetermined pressure if the observed currently existing temperature is less than a mean of an expected range of temperatures to maintain a pressure applied to the pressure vessel in an acceptable range about such preselected first pressure.

4. A method of storing and delivering a fluid according to claim 2, wherein the fluid is dichlorosilane, and the step of applying a nonreactive gas at said first predetermined pressure to the pressure vessel comprises applying a nonreactive gas at a pressure which combines with a partial gas pressure of the dichlorosilane, thereby maintaining a total gas pressure in the pressure vessel in a desired range about a preselected median pressure value.

5. A method of storing and delivering a fluid according to claim 4,
   wherein the step of applying the nonreactive gas comprises applying the nonreactive gas at a pressure which combines with the partial gas pressure to maintain a total gas pressure of substantially 40 PSIG in the pressure vessel:
   and wherein maintaining the evaporator vessel at a first predetermined temperature comprises maintaining the evaporator vessel at a temperature of substantially 160 degrees Fahrenheit.

6. A method of storing and delivering a fluid according to claim 4, wherein the nonreactive gas is applied at a pressure which maintains the total gas pressure in the pressure vessel between 15 and 65 PSIG as a desired range about a preselected pressure value of 40 PSIG, and wherein the evaporator vessel is maintained at a temperature of substantially 160 degrees Fahrenheit.

7. A method of storing and delivering a fluid according to claim 4, wherein reducing the pressure of the drawn off fluid to a second predetermined pressure comprises drawing said fluid through a pressure regulator to reduce the pressure from such first predetermined pressure to such second predetermined pressure, and maintaining said pressure regulator at an elevated temperature with respect to its ambient.

8. A method of storing and delivering a fluid according to claim 2, wherein reducing the pressure of the drawn off fluid to a second predetermined pressure comprises reducing the pressure of the drawn off fluid in a pressure regulator to the second predetermined pressure, and maintaining the temperature of the pressure regulator at a temperature above an ambient temperature range.

9. A method of storing and delivering a fluid according to claim 8, wherein storing the fluid in its liquid state in a pressure vessel located at a site remote from a processing facility comprises storing the fluid at a site which is subject to climatically determined temperature variations, and wherein applying a nonreactive gas at said first predetermined pressure to the pressure vessel comprises observing a current climatically determined environmental temperature, comparing such observed current temperature with an expected range of environmental temperatures, and, if the observed current temperature is less than a mean temperature of the expected range of environmental temperatures, applying the nonreactive gas at a first predetermined pressure proportionally less than a desired mean value of an expected pressure variation of a total gas pressure in the pressure vessel due to variations in the environmental temperatures.

10. A method of storing and delivering a fluid according to claim 9, wherein the fluid is dichlorosilane and applying a nonreactive gas at said first predetermined pressure to the pressure vessel comprises applying a nonreactive gas at a pressure which combines with a partial gas pressure of the dichlorosilane, thereby maintaining a total gas pressure in the pressure vessel in a desired range about the desired mean value of the expected pressure variation.

11. A method of storing and delivering a fluid according to claim 10, wherein the nonreactive gas is helium stored at an initial first helium gas pressure higher than the first predetermined pressure, and the pressure of the helium is reduced to such first predetermined pressure before being applied to said pressure vessel.

12. Apparatus for storing and delivering a fluid, comprising:
- a pressure vessel for storing the fluid under pressure in its liquid state, said pressure vessel being located remote from a processing facility;
- an evaporator vessel located at the processing facility;
- a fluid duct coupled between the pressure vessel and the evaporator vessel;
- means coupled to the pressure vessel for raising the pressure of the fluid in the pressure vessel to a first predetermined pressure to urge the fluid through the duct from the pressure vessel toward the evaporator vessel; and
- means for maintaining the fluid in the evaporator vessel substantially at a first predetermined temperature at which the fluid while remaining at such first predetermined pressure is substantially always in a gaseous state.

13. Apparatus for storing and delivering a fluid according to claim 12, wherein the evaporator vessel is located adjacent to a boundary wall of and within the confines of the processing facility.

14. Apparatus for storing and delivering a fluid according to claim 12, wherein the evaporator vessel is located adjacent to a boundary wall of and within the confines of the processing facility, the apparatus further comprising:
- a duct coupled between the evaporator vessel and an apparatus using the fluid;
- means, coupled into said duct between the evaporator vessel and said apparatus using the fluid, for reducing the pressure of the fluid flowing through said duct between the evaporator vessel and the fluid using apparatus from said first predetermined pressure to a second predetermined pressure at which the fluid retains its gaseous state at a temperature in a range of temperatures expected to be maintained within said processing facility; and
- means for maintaining the pressure reducing means at a temperature above the expected range of ambient temperatures within said processing facility.

15. Apparatus for storing and delivering a fluid according to claim 14, wherein the fluid which is to be stored and delivered is dichlorosilane and the means coupled to the pressure vessel for raising the dichlorosilane stored in the pressure vessel to a first predetermined pressure comprises:
- means for storing a nonreactive gas under pressure greater than the first predetermined pressure;
- means for reducing the pressure of the nonreactive gas to such first predetermined pressure; and
- means for applying the nonreactive gas at such first predetermined pressure to the pressure vessel to raise the pressure of the dichlorosilane to such first predetermined pressure.

16. Apparatus for storing and delivering a fluid according to claim 15, wherein the site at which the pressure vessel is located is subject to climatic temperature variations, such temperature variations being impressed on the dichlorosilane stored in the pressure vessel to affect a partial gas pressure component of the dichlorosilane of a total pressure value of the first predetermined pressure in the pressure vessel, such means for reducing the pressure of the nonreactive gas to such first predetermined pressure including means for adjusting the value of the pressure of the nonreactive gas to be applied to the pressure vessel to allow such gas to be applied to a first predetermined pressure lower than a desired mean value of an acceptable range of pressures expected in the pressure vessel as a result of such climatic temperature variations.

17. Apparatus for storing and delivering a fluid according to claim 16, wherein the first predetermined pressure is in a range between 15 PSIG and 65 PSIG and the means for maintaining the dichlorosilane in the evaporator vessel is capable of maintaining the first predetermined temperature substantially at a nominal temperature of 160 degrees Fahrenheit.

18. Apparatus for storing and delivering a fluid according to claim 17, wherein the means for reducing the pressure of the dichlorosilane from such first predetermined pressure to such second predetermined pressure is an adjustable regulator capable of maintaining the second predetermined pressure of the dichlorosilane at 9 PSIG as the first predetermined pressure ranges between 15 and 65 PSIG.

* * * * *